United States Patent [19]

Terada et al.

[11] Patent Number: 4,733,371
[45] Date of Patent: Mar. 22, 1988

[54] SEMICONDUCTOR MEMORY DEVICE WITH HIGH VOLTAGE SWITCH

[75] Inventors: Yasushi Terada; Takeshi Nakayama; Kazuo Kobayashi, all of Itami, Japan

[73] Assignee: Mitsubishi Denki Kabushiki Kaisha, Tokyo, Japan

[21] Appl. No.: 900,440

[22] Filed: Aug. 26, 1986

[30] Foreign Application Priority Data

Aug. 30, 1985 [JP] Japan .................. 60-192808

[51] Int. Cl.$^4$ ................ G11C 11/40; H03K 17/10
[52] U.S. Cl. .................... 365/185; 365/191; 365/226; 307/571; 307/579
[58] Field of Search ............ 365/149, 189, 191, 230, 365/226, 227, 228, 185; 307/239, 571, 578, 579

[56] References Cited

U.S. PATENT DOCUMENTS

| | | | |
|---|---|---|---|
| 4,506,350 | 3/1985 | Asano | 365/191 |
| 4,545,038 | 10/1985 | Bellay et al. | 365/230 |
| 4,677,313 | 6/1987 | Mimoto | 365/104 X |
| 4,689,495 | 8/1987 | Liu | 365/228 X |

OTHER PUBLICATIONS

ISSCC 83, Feb. 24, 1983, THPM 13.2: A 5 V-Only EEPROM with Intenal Program/Erase Control, pp. 164–165; 302.
ISSCC 83, Feb. 24, 1983, THPM 13.4: +5 V-Only 32K EEPROM, pp. 168 & 169.
ISSCC 85, Feb. 14, 1985, THPM 13.5: A 64K EEPROM with Extended Temperature and Page Mode Operation, pp. 170–171; 336.
ISSCC 85, Feb. 14, 1985, THPM 13.6: Two 35 ns 64K CMOS EEPROMs, pp. 172–173; 337–338.

*Primary Examiner*—Stuart N. Hecker
*Assistant Examiner*—Alyssa H. Bowler
*Attorney, Agent, or Firm*—Lowe, Price, LeBlanc, Becker & Shur

[57] ABSTRACT

A semiconductor memory device according to the present invention includes a first high-voltage switch (20) formed by a first transistor (21), a second transistor (22), a first capacitor (23) and a third transistor (24) and a second high-voltage switch (30) formed by a fourth transistor (31), a fifth transistor (32), a second capacitor (33) and a sixth transistor (34). In a write cycle, input data are stored in capacitors (25, 35). In an erase cycle, the second high-voltage switch (30) is driven by a clock signal ($\phi_2$) to make the control gate line (4) rise at a high voltage. In a program cycle, the first high-voltage switch (20) is driven by a clock signal ($\phi_1$) to make the bit line of the bit to be written with data "0" rise at a high voltge, and upon completion of the program cycle, charges stored in the capacitor (25) are discharged to reset a column latch. Thus, the device requires no inverter and may be provided with only one high voltage source.

3 Claims, 5 Drawing Figures

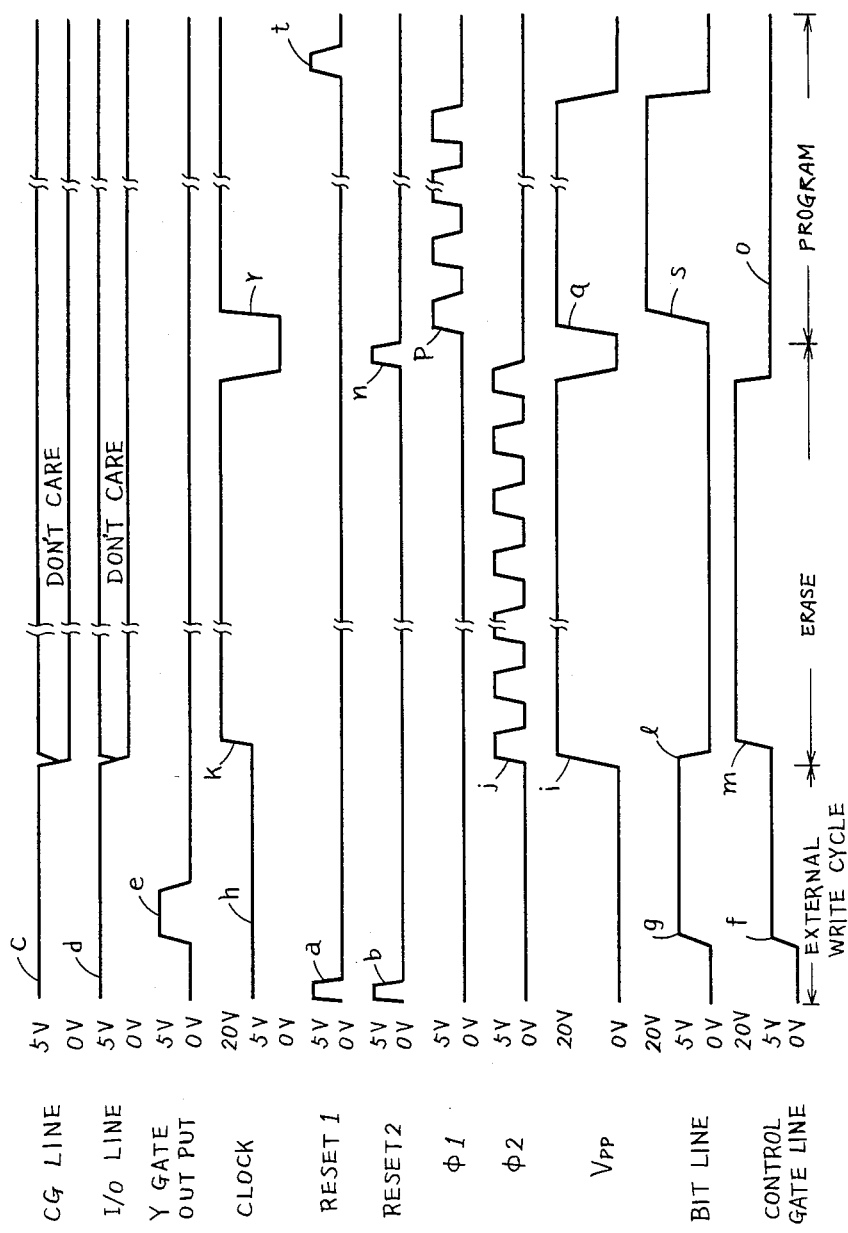

SEMICONDUCTOR MEMORY DEVICE WITH HIGH VOLTAGE SWITCH

BACKGROUND OF THE INVENTION

1. Field of the Invention

The present invention relates to a semiconductor memory device. More particularly, it relates to an electrically writable/erasable and programmable ROM (EEPROM).

2. Description of the Prior Art

A column latch circuit of such EEPROM is disclosed in IEEE ISSCC "Digest of Technical Papers", 1985, p. 170.

FIG. 1 is an electric circuit diagram showing a conventional column latch circuit, and FIG. 2 is an electric circuit diagram showing a column latch circuit and high-voltage switches.

Referring to FIGS. 1 and 2, description is now made on the structure of the column latch circuit of the conventional EEPROM. A first voltage $V_{PP1}$ is supplied to a high-voltage switch 1, which is formed by enhancement n-channel MOS transistors (hereinafter referred to as transistors) 101 and 102 and a capacitor 103 as shown in FIG. 2. Similarly, a second high-voltage switch 2 is formed by transistors 201 and 202 and a capacitor 203.

A bit line 3 is connected to the first high-voltage switch 1 and a control gate line 4 is connected to the second high-voltage switch 2. Eight such bit lines 3 are provided in case of forming one byte by eight bits, and one such control gate line 4 is provided with respect to eight bit lines 3. The bit line 3 is connected with an inverter 5, which is formed by a transistor 51 and a depletion n-channel MOS transistor 52. That is, the transistor 51 has a gate connected to the bit line 3, a grounded source and a drain connected to the source and the gate of the depletion n-channel MOS transistor 52 as well as to the gate of a transistor 7. The source of the transistor 7 is grounded and the drain thereof is connected to the bit line 3.

The bit line 3 is connected with the drain of a selection gate 11, whose gate is connected with a word line 10. The source of the selection gate 11 is connected to the drain of a memory transistor 10, whose source is grounded. The bit line 3 is further connected with the source of a Y gate 14, which has a gate connected with a Y gate line 13 and a drain connected with an I/O line 16.

The control gate line 4 is connected with an inverter 6 which is formed by a transistor 61 and a depletion MOS transistor 62. That is, the transistor 61 has a gate connected to the control gate line 4 and a grounded source. The drain of the transistor 61 is connected to the source and the gate of the depletion MOS transistor 62, as well as to the gate of a transistor 8. The depletion MOS transistor 62 is supplied in its drain with a first clock signal 9. The control gate line 4 is connected with the drain of the transistor 8, whose source is grounded.

Further, the control gate line 4 is connected with the drain of a selection gate 12, whose gate is connected with the word line 10 and the source thereof is connected to the gate of the aforementioned memory transistor 18. The control gate line 4 is further connected to the source of a Y gate 15, whose gate is connected with the Y gate line 13 and the drain thereof is connected with a CG line 17.

A bit line latch circuit is formed by the first clock signal 9, the transistors 7 and 51 and the depletion MOS transistor 52, and a control gate line latch circuit is formed by the first clock signal 9, the transistors 8 and 61 and the depletion MOS transistor 62. The bit line latch circuit and the control gate line latch circuit are referred to as a column latch circuit in total.

With reference to FIGS. 1 and 2, description is now made on the operation of the column latch circuit. In general, write operation in memory cells of the EEPROM requires an extremely long period of time (several to 10 mesec), differently from that required for a static RAM. Therefore, several to several ten seconds are required in case where a large number of bytes are to be reloaded, contents of the entire chip are to be updated or high integration is achieved. Thus, an EEPROM exceeding 64 Kbits is generally provided with page mode writing for simultaneously performing writing of a plurality of bytes.

In this case, data to be written must be latched per bit line 3 and control gate line 4. The gate of the memory transistor 18 as shown in FIG. 1 is in two-layer structure, in which the lower gate is covered by an insulating layer and called as a floating gate. This floating gate stores positive and negative charges to change the threshold of the memory transistor 18, thereby to store binary data of "0" and "1". An oxide film partially forming an overlapping portion of the floating gate and the drain is made extremely thin so that electrons are tunnelled in the thin oxide film, to be transferred between the floating gate and the drain.

The operation for injecting the electrons into the floating gate thereby to shift the threshold of the memory transistor 18 to a higher value is referred to as erase operation, which is adapted to store the data "1". The operation for extracting the electrons from the floating gate to shift the threshold to a lower value is referred to as program operation, which is adapted to store the data "0". In the erase operation, a high voltage is applied to the word line 10 and the control gate line 4, and the bit line 3 is converted to the ground potential. In the program operation, a high voltage is applied to the word line 10 and the bit line 3, and the control gate line 4 is grounded.

In a recent EEPROM, high voltages required for the erase operation and the program operation are generated on the chip, whose current supplying ability is limited and hence the high voltages are switched by the high-voltage switches 1 and 2. In order to make the bit line 3 rise at a high voltage, the bit line 3 is held substantially at the supply voltage level, the Y gate line 13 is converted to the ground potential, the Y gate 14 is turned off and the high-voltage switch 1 is turned on thereby to supply the first high voltage $V_{PP1}$ to the bit line 3.

In order to make the control gate line 4 rise at a high voltage, the control gate line 4 is held substantially at the supply voltage level, the Y gate line 13 is converted to the ground potential, the Y gate 15 is turned off and the high-voltage switch 2 is turned on to supply a second high voltage $V_{PP2}$ to the control gate line 4.

In other words, the column latch circuit serves to hold the potential of the control gate line 4 of the byte whose data must be updated substantially at the supply voltage level as well as to hold the bit line 3 of the bit to be written with the data "0" substantially at the supply voltage level.

Description is now made in further detail on the prior art example as shown in FIG. 1. In a write mode, the first clock signal 9 becomes the supply voltage level, whereby the inverters 5 and 6 are respectively activated. A signal of the supply voltage level is applied to the CG line 17 and an inverted signal of the input data is applied to the I/O line 16, whereby the Y gate line 13 of the byte to be written becomes a high level.

When the control gate line 4 becomes a high level, a low-level signal is applied to the gate of the transistor 8, which is then turned off. The second high voltage $V_{PP2}$ is thus applied to the control gate line 4 through the high-voltage switch 2, whereby the control gate line 4 rises at a high voltage. When the bit line 3 is at a high level, it also rises at a high voltage on the leading edge of the first high voltage $V_{PP1}$. When, however, the bit line 3 is at a low level, a high-level signal is applied to the gate of the transistor 7 which has been turned on, whereby the bit line 3 is held at the low level even if the first high voltage $V_{pp1}$ rises, and hence the memory transistor 18 is not programmed.

The conventional EEPROM of the above structure requires the two-system high voltages $V_{PP1}$ and $V_{PP2}$, while the high-voltage outputs must be switched and the inverters 5 and 6 are required. Provision of the two system high voltages leads to increase in chip area, and the high-voltage outputs cannot be readily switched. Although EEPROMs have been prepared by metal-oxide semiconductors (MOS) in recent years, further, inverters formed by complementary metal-oxide semiconductors (CMOS) lead to increase in chip area, which may cause latch-up phenomenon.

SUMMARY OF THE INVENTION

Accordingly, the principal of the present invention is to provide a semiconductor memory device which has only one high voltage source with no switching required, and which requires no inverter.

Briefly stated, according to the present invention, a first clock signal to be applied to a first capacitor included in a first high-voltage switch is turned on/off by a third transistor and a second clock signal to be applied to a second capacitor forming a second high-voltage switch is turned on/off by a sixth transistor so that the first high-voltage switch is activated on the basis of the first clock signal to boost a bit line at a high voltage through a first transistor and a second transistor while the second high-voltage switch is activated on the baiss of the second clock signal to boost a control gate line at a high voltage through a fourth transistor and a fifth transistor.

Thus, according to the present invention, a high voltage source and the first and second high-voltage switches are provided to activate the first high-voltage switch on the basis of the first clock signal as well as to activate the second high-voltage switch on the basis of the second clock signal, whereby the high voltage source may not be provided in two systems as in the conventional case, and the device requires no inverter.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a timing chart for illustrating the operation of the embodiment of the present invention.

DESCRIPTION OF THE PREFERRED EMBODIMENT

Figure 3:
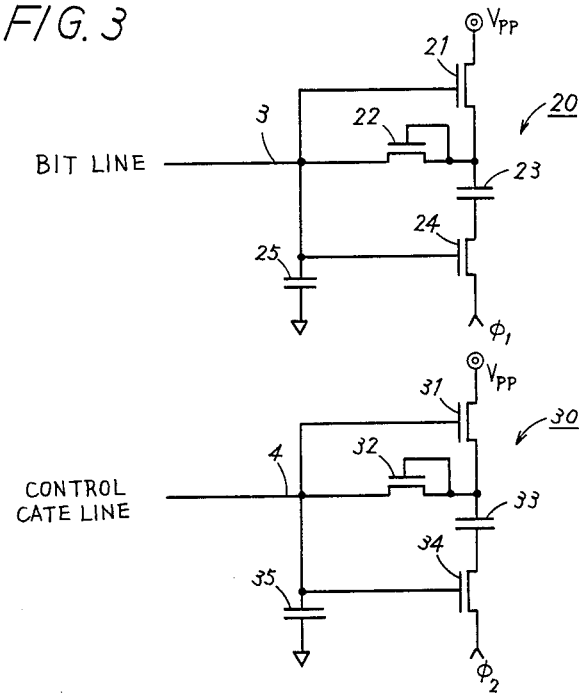
FIG. 3 is an electric circuit diagram showing high-voltage switches according to an embodiment of the present invention.
Figure 4:
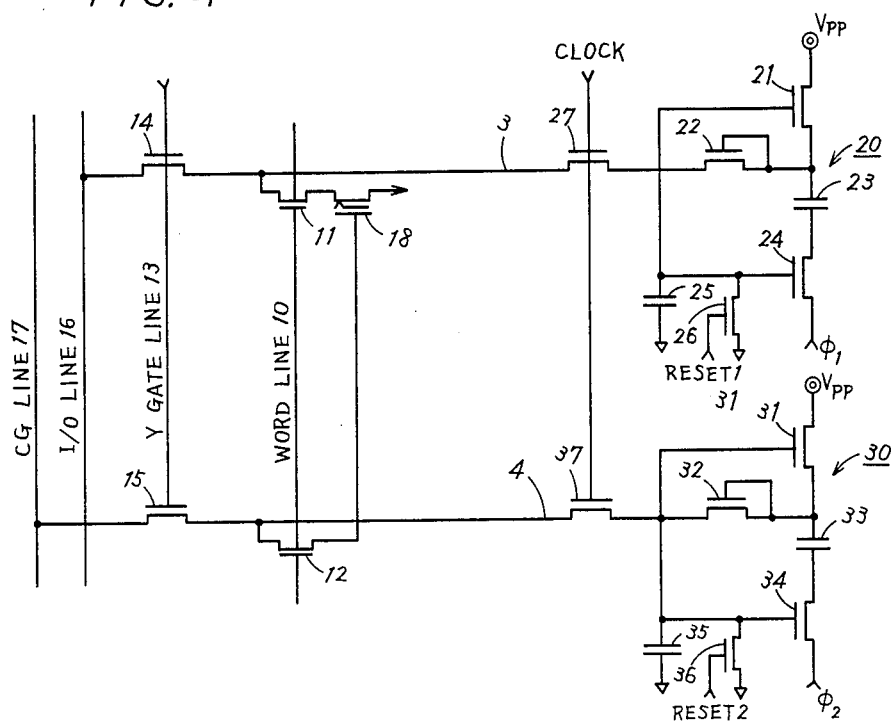
FIG. 4 is an electric circuit diagram showing the embodiment of the present invention.

FIG. 3 is an electric circuit diagram showing an embodiment of the present invention, and FIG. 4 is a circuit diagram showing a column latch circuit of a semiconductor memory device employing high-voltage switches as shown in FIG. 3.

Referring to FIGS. 3 and 4, description is now made on the structure of this embodiment. A first high-voltage switch 20 is formed by a first transistor 21, a second transistor 22, a third transistor 24, a first capacitor 23 and another capacitor 25. The transistor 21 is supplied in its drain with a high voltage $V_{PP}$. As shown in FIG. 4, the gate of the transistor 21 is connected to a bit line 3 through the source and the drain of a seventh transistor 27, as well as to the drain of the transistor 22, an end of the capacitor 25, the drain of a ninth transistor 26 and the gate of the transistor 24.

The source of the transistor 21 is connected to an end of the capacitor 23 and the gate and the source of the transistor 22. The other end of the capacitor 25 and the source of the transistor 26 are grounded. A first reset signal is supplied to the gate of the transistor 26. A first clock signal $\phi_1$ is supplied to the source of the transistor 24.

Similarly to the first high-voltage switch 20, a second high-voltage switch 30 is formed by a fourth transistor 31, a fifth transistor 32, a sixth transistor 34, an eighth transistor 37, a tenth transistor 36, a second capacitor 33 and another capacitor 35. A high voltage $V_{PP}$ is supplied to the drain of the fourth transistor 31 and a second clock signal $\phi_2$ is supplied to the source of the transistor 34 while a second reset signal is supplied to the gate of the transistor 36 and a control gate line 4 is connected to the drain of the transistor 37.

Figure 1:
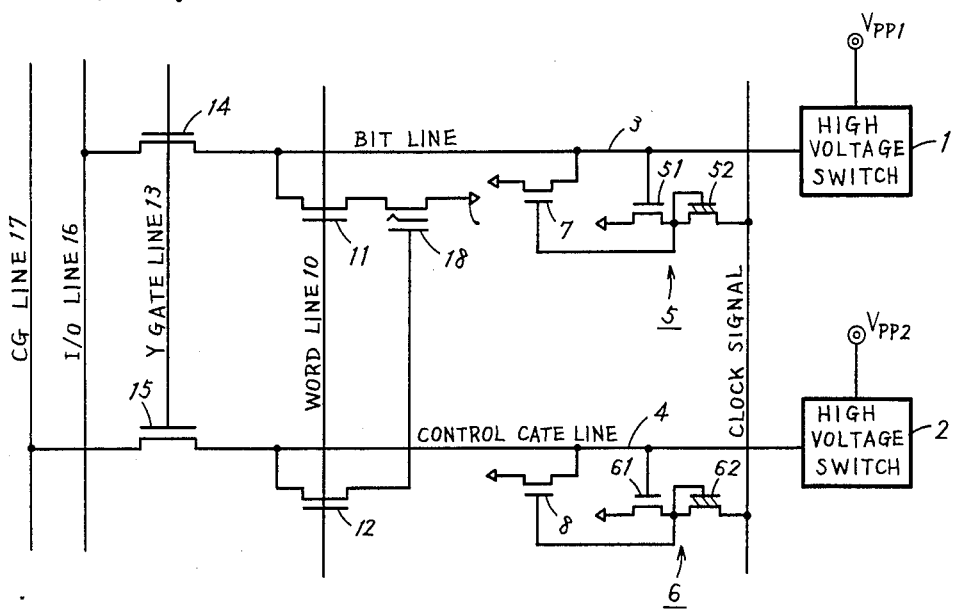
FIG. 1 is an electric circuit diagram showing a conventional column latch circuit.
Figure 2:
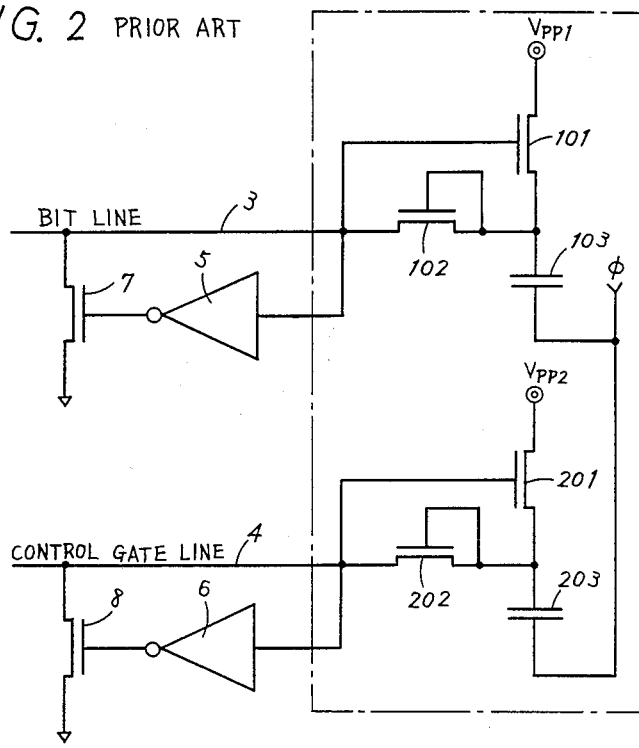
FIG. 2 is an electric circuit diagram showing conventional high-voltage switches.

Similarly to the structure as shown in FIG. 1, provided are a word line 10, selection gates 11 and 12, a Y gate line 13, Y gates 14 and 15, an I/O line 16, a CG line 17 and a memory transistor 18.

FIG. 5 is a timing chart for illustrating the operation of the embodiment of the present invention.

With reference to FIGS. 3 to 5, the operation of the embodiment is not definitely described.

Upon application of power and completion of a write cycle, the first reset signal is supplied to a gate of the transistor 26 and the second reset signal is supplied to the gate of the transistor 36. In response to this, the transistors 26 and 36 are respectively made conductive, whereby charges respectively stored in the capacitors 25 and 35 are discharged and the column latch is reset.

In starting of an external write cycle, the CG line 17 is held at a high level as shown at FIG. 5c, and the potential on the I/O line 16 is changed to a low or high level in response to input data of "1" or "0". In the illustrated case, the data "0" is inputted and the I/O line 16 becomes a high level as shown at FIG. 5d. With respect to a Y address combination, a Y gate line 13 becomes a high level as shown at FIG. 5e, whereby the Y gates 14 and 15 are made conductive respectively. Then the I/O line 16 is connected with the bit line 3 of the selected byte and the CG line 17 is connected with the control gate line 4.

The control gate line 4 becomes a high level as shown at FIG. 5f, and the bit line 3 becomes a high level as shown at FIG. 5g when the input data is "0". During the external write cycle, the clock signal is held at a high level as shown in FIG. 5h, whereby the transistors 27 and 37 are made conductive. Thus, the respective potentials on the bit line 3 and the control gate line 4 are stored in the capacitors 25 and 35.

Upon completion of the external write cycle, an erase cycle starts, whereby the high voltage $V_{PP}$ rises to 20 V as shown at FIG. 5i and the second clock signal $\phi_2$ starts oscillation as shown at FIG. 5j. The clock signal also rises to 20 V as shown at FIG. 5k. During this erase cycle, the bit line 3 is held at the low level as shown at FIG. 5l, although the method of holding the bit line 3 at the low level is not shown. The control gate line 4 of the selected byte is made high voltage since the gate potential of the transistor 34 is at a high level, whereby the second clock signal $\phi_2$ is supplied to the source of the transistor 31 through the capacitor 33. Thus, the transistor 31 is made conductive and the control gate line 4 rises at the high voltage $V_{PP}$ as shown at FIG. 5m.

Upon completion of the erase cycle, the second reset signal becomes a high level as shown at FIG. 5n, whereby the transistor 36 is made conductive. Then the charges stored in the capacitor 35 are discharged and the latch of the control gate line 4 is reset, whereby the control gate line 4 is held at a lwo level during a subsequent program cycle as shown at FIG. 5o.

In the program cycle, the clock signal $\phi_1$ starts oscillation as shown at FIG. 5p, whereby the transistor 24 of the bit to be written with "0" is turned on and also the transistor 21 is turned on through the capacitor 23. As the result, the high voltage $V_{PP}$ rises as shown at FIG. 5q and the clock signal also rises at a high voltage as shown at FIG. 5r. Consequently, the bit line 3 of the bit to be written with "0" rises at a high voltage as shown at FIG. 5s. Upon completion of the program cycle, the first reset signal becomes a high level as shown at FIG. 5t and the transistor 26 is made conductive, whereby the charges stored in the capacitor 25 are discharged and the column latch is reset.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising bit lines, control gate lines, a high voltage source and first and second high-voltage switches, said first high-voltage switch including:
 a first transistor having a drain connected to said high-voltage source and a gate connected to said bit line,
 a second transistor having a drain connected to said bit line and a gate and a source connected to the source of said first transistor,
 a first capacitor having an end connected to the source of said first transistor and said gate and source of said second transistor, and
 a third transistor having a drain connected to the other end of said first capacitor, a gate connected to said bit line and a source applied with a first clock signal, said second high-voltage switch including:
 a fourth transistor having a drain connected to said high voltage source and a gate connected to said control gate line,
 a fifth transistor having a drain connected to said control gate line and a source connected to the source of said fourth transistor,
 a second capacitor having an end connected to said source of said fourth transistor and said gate and source of said fifth transistor, and
 a sixth transistor having a drain connected to the other end of said second capacitor, a gate connected to said control gate line and a source supplied with a second clock signal.

2. A semiconductor memory device in accordance with claim 1, wherein
 said first high-voltage switch includes a seventh transistor having a gate supplied with a third clock signal, a drain to which said bit line is connected and a source to which said gate of said first transistor, said drain of said second transistor and said gate of said third transistor are connected, and
 said second high-voltage switch includes an eighth transistor having a gate supplied with a fourth clock signal, a drain to which said control gate line is connected and a source to which said gate of said fifth transistor, said drain of said sixth transistor and said gate of said seventh transistor are connected.

3. A semiconductor memory device in accordance with claim 2, wherein
 said first high-voltage switch includes a ninth transistor having a drain connected to said gate of said third transistor, a gate supplied with a first reset signal and a grounded source, and
 said second high-voltage switch includes a tenth transistor having a drain connected to said gate of said seventh transistor, a gate supplied with a second reset signal and a grounded source.

* * * * *